United States Patent [19]
Ong

[11] Patent Number: 5,614,859
[45] Date of Patent: Mar. 25, 1997

[54] TWO STAGE VOLTAGE LEVEL TRANSLATOR

[75] Inventor: Adrian E. Ong, Boise, Id.

[73] Assignee: Micron Technology, Inc., Boise, Id.

[21] Appl. No.: 511,344

[22] Filed: Aug. 4, 1995

[51] Int. Cl.$^6$ ........................................................ H03L 5/00
[52] U.S. Cl. .......................... 327/333; 327/537; 326/80; 326/83
[58] Field of Search .............................. 327/99, 108, 333, 327/112, 319, 306, 308, 390, 403, 404, 535, 536, 537, 581; 326/80, 81, 83, 87, 68, 50; 307/18, 28, 29, 38, 39

[56] References Cited

U.S. PATENT DOCUMENTS

| | | | |
|---|---|---|---|
| 4,408,135 | 10/1983 | Yuyama et al. | 326/60 |
| 4,731,553 | 3/1988 | Van Lehn et al. | 326/27 |
| 4,963,766 | 10/1990 | Lundberg | 326/58 |
| 5,034,625 | 7/1991 | Min et al. | 327/536 |
| 5,128,560 | 7/1992 | Chern et al. | 327/530 |
| 5,132,575 | 7/1992 | Chern | 307/530 |
| 5,136,191 | 8/1992 | Nunogami | 326/81 |
| 5,144,165 | 9/1992 | Dhong et al. | 326/80 |
| 5,175,450 | 12/1992 | Chern | 307/530 |
| 5,248,907 | 9/1993 | Lin et al. | 326/33 |
| 5,296,757 | 3/1994 | Koizumi | 326/21 |
| 5,369,317 | 11/1994 | Casper et al. | 326/87 |
| 5,394,320 | 2/1995 | Blodgett | 363/60 |
| 5,398,318 | 3/1995 | Hiraishi et al. | 326/83 |
| 5,410,508 | 4/1995 | McLaury | 365/189.09 |
| 5,493,244 | 2/1996 | Pathak et al. | 327/333 |
| 5,500,817 | 3/1996 | McLaury | 365/189.05 |

*Primary Examiner*—Timothy P. Callahan
*Assistant Examiner*—My-Trang Nu Ton

[57] ABSTRACT

A method and a voltage level translator circuit for driving a potential of an output node of the voltage level translator circuit to a pumped potential with minimal power consumption of the pump. Power is conserved by coupling the output node to a supply node through a first driver circuit and then driving the potential of the output node toward the supply potential. After the potential of the output node is pulled toward the supply potential the output node is decoupled from the supply node and coupled to the pumped supply node through a second driver circuit. The potential of the output node is then driven toward the pumped potential. In one embodiment a detector circuit of the invention monitors the first driver circuit and determines when to deactivate the first driver circuit and when to actuate the second driver circuit.

16 Claims, 3 Drawing Sheets

TWO STAGE VOLTAGE LEVEL TRANSLATOR

BACKGROUND OF THE INVENTION

Typically in integrated circuit memories isolation devices have been interposed between a p-sense amplifier and a shared n-sense amplifier in the memory array. However in order to conserve die space only one p-sense amplifier may be used. In this case the isolation device is interposed between a digit line pair and the p-sense amplifier and between the digit line pair and the n-sense amplifier. In order for the p-sense amplifier to pass the full value of the charge on the digit line, the isolation device, typically an n-channel transistor, must have a gate voltage equal to the value of the charge plus a threshold voltage of the transistor. Therefore it becomes necessary to drive the potential of the gate of the isolation n-channel transistor to a pumped potential. The pumped potential is a potential elevated above the supply potential. To do this the gate is driven to a pumped supply potential by a driver circuit which is interposed between a pumped node, which has been pumped to the pumped potential, and the gate of the n-channel. However, pumping the supply potential to a pumped potential at the pumped node consumes a significant amount of power.

SUMMARY OF THE INVENTION

The invention is a voltage level translator circuit having first and second driver circuits connected at their outputs to an output node of the voltage level translator circuit. Typically the output node is a transistor gate, such as the gate of an isolation device. The first driver circuit is interposed between a reference node and a supply node connected to a supply potential. The second driver circuit is interposed between a pumped supply node and the reference node. The pumped supply node is pumped to a pumped potential greater than the supply potential by a pump circuit. The output node is driven toward the supply potential by the first driver circuit and then is driven toward the pumped supply potential by the second driver circuit. The actuation and deactuation of the driver circuits may be controlled by signals external to the circuit of the invention or a detector circuit of the invention. The detector circuit determines when to deactuate the first driver circuit and actuate the second driver circuit.

The invention is also the method of driving the output node to the pumped potential with minimal power consumption. Power is conserved by coupling the output node to the supply node and then driving the potential of the output node toward the supply potential. After the potential of the output node is pulled toward the supply potential, the output node is decoupled from the supply node and coupled to the pumped supply node. The potential of the output node is then driven toward the pumped potential. Since the pump circuit is only about 30–40% efficient it takes less power to pump the output node toward the pumped potential by coupling it to the supply node prior to coupling the output node to the pumped supply node. Thus by using the circuit and method of the invention power is conserved.

DETAILED DESCRIPTION OF THE INVENTION.

Figure 1:
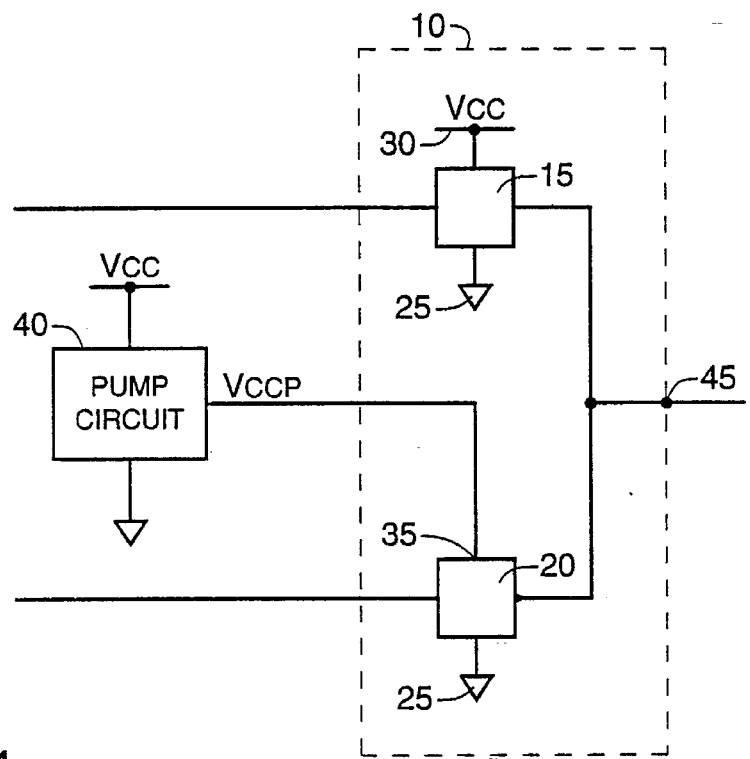
FIG. 1 is a block schematic of the two stage voltage level translator circuit of a first embodiment of the invention.

The circuit of the invention is a two stage voltage level translator circuit. A first embodiment of the voltage level translator circuit 10 of the invention is shown in FIG. 1. The voltage level translator 10 comprises a first driver circuit 15 and a second driver circuit 20. The first driver circuit 15 is a driver circuit interposed between a reference node 25 and a supply node 30 connected to a supply potential. The second driver circuit 20 is interposed between a pumped supply node 35 and the reference node 25. The pumped supply node is connected to a pump circuit 40 which supplies a pumped potential greater than the supply potential to the pumped supply node.

In the method of the invention the first driver circuit 15 is actuated to couple output node 45 of the voltage level translator circuit 10 to the supply node 30. The potential of output node 45 is then driven toward the supply potential. Next, the first driver circuit 15 is deactuated, thereby decoupling supply node 30 and output node 45, and the second driver circuit 20 is actuated. When actuated, the second driver circuit 20 couples node 45 to the pumped supply node 35. The potential of node 45 is then driven from the potential which it reached when being driven toward the supply potential, ideally from the supply potential, toward the pumped potential. Thus, the potential of output node 45 is driven toward the pumped potential, but power is conserved since the potential of output node 45 is driven to the supply potential without the use of the pump circuit 40. The pump circuit 40 is only needed to increase the potential of output node 45 beyond the supply potential.

Figure 2:
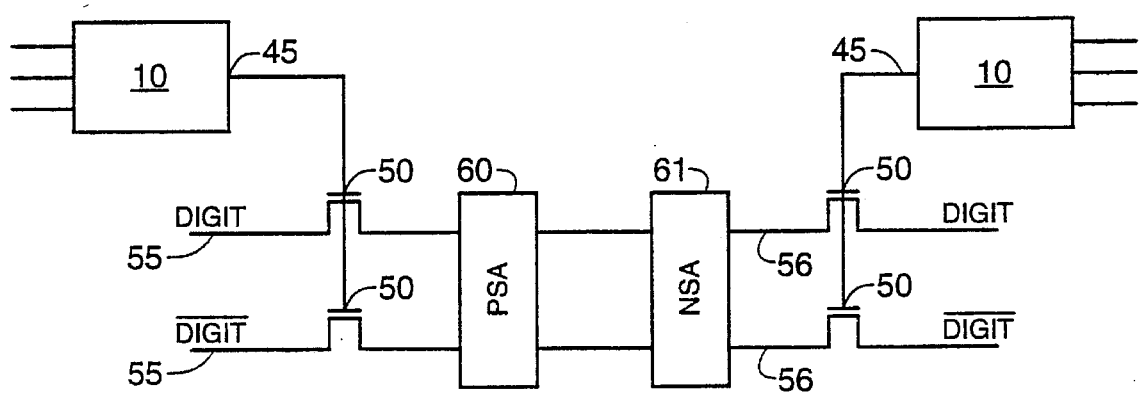
FIG. 2 is a block schematic of the voltage level translator circuit of the invention and isolation gates, digit line pairs, and p and n-sense amps.

FIG. 2 shows output node 45 of the level translator circuit 10 connected to gates of isolation devices 50. Two of the isolation devices 50 are interposed between a digit line pair 55 and a p-sense amplifier 60 (PSA), and the other isolation devices 50 are interposed between digit line 56 and n-sense amplifier (NSA) 61. Thus the isolation devices 50 are actuated by the pumped potential of the level translator circuit 10, thereby allowing the isolation devices to drive a full value of the digit line charge through the n-channel isolation devices 50.

Figure 3:
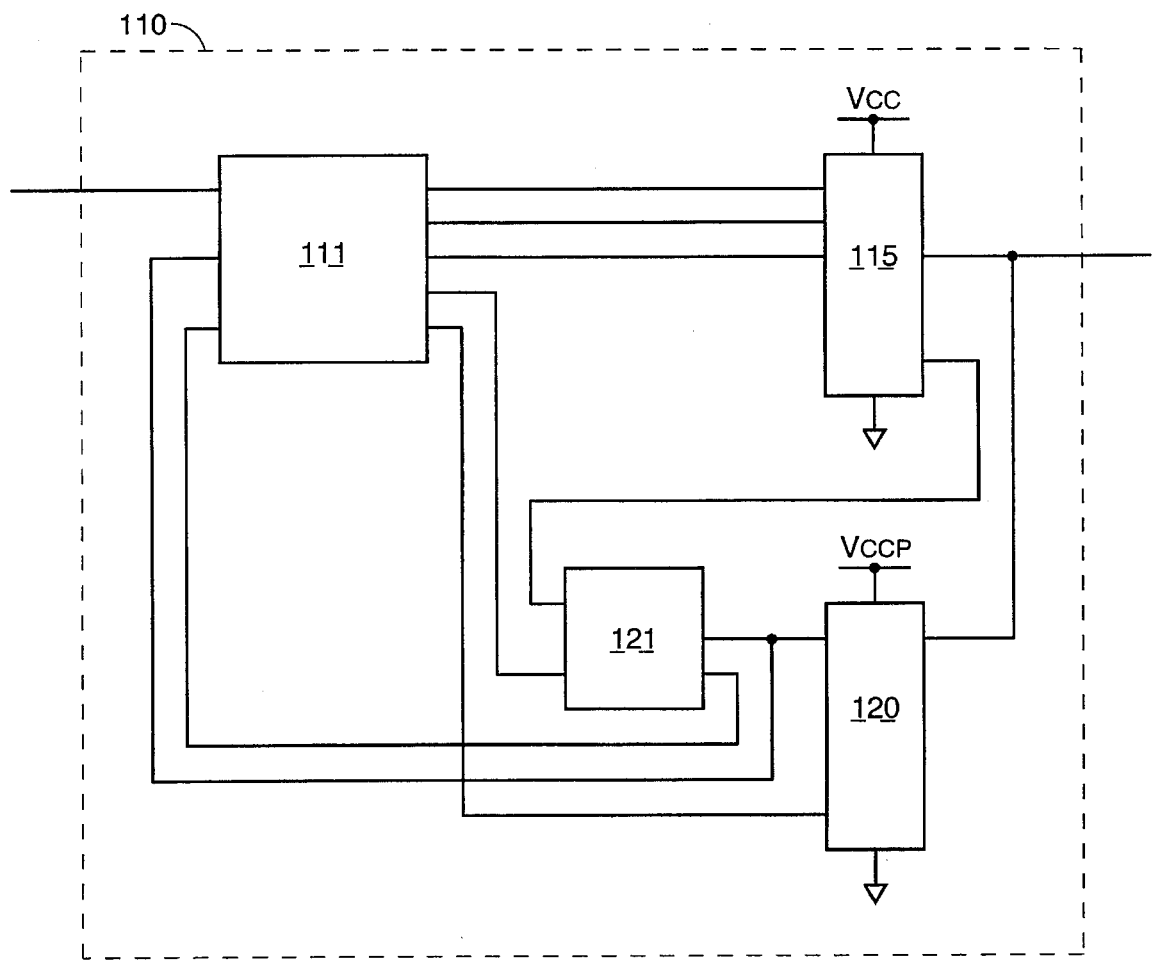
FIG. 3 is a block schematic of a two stage voltage level translator circuit of a second embodiment of, the invention.

An alternate embodiment of the invention is shown in FIG. 3. In this case a level translator circuit 110 of the invention is self timed and has a first driver circuit 115 and a second driver circuit 120. However, in this embodiment a detector circuit 121 monitors the operation of the first driver circuit 115 to determine when the first driver circuit 115 drives the potential of output node 145 to the supply potential. The detector circuit 121 generates signals to a control circuit 111 which deactuates the first driver circuit 115 and actuates the second driver circuit 120 thereby allowing the second driver circuit 120 to drive the potential of node 145 from the supply potential to the pumped supply potential (see the output signal shown in FIG. 3).

Figure 4:
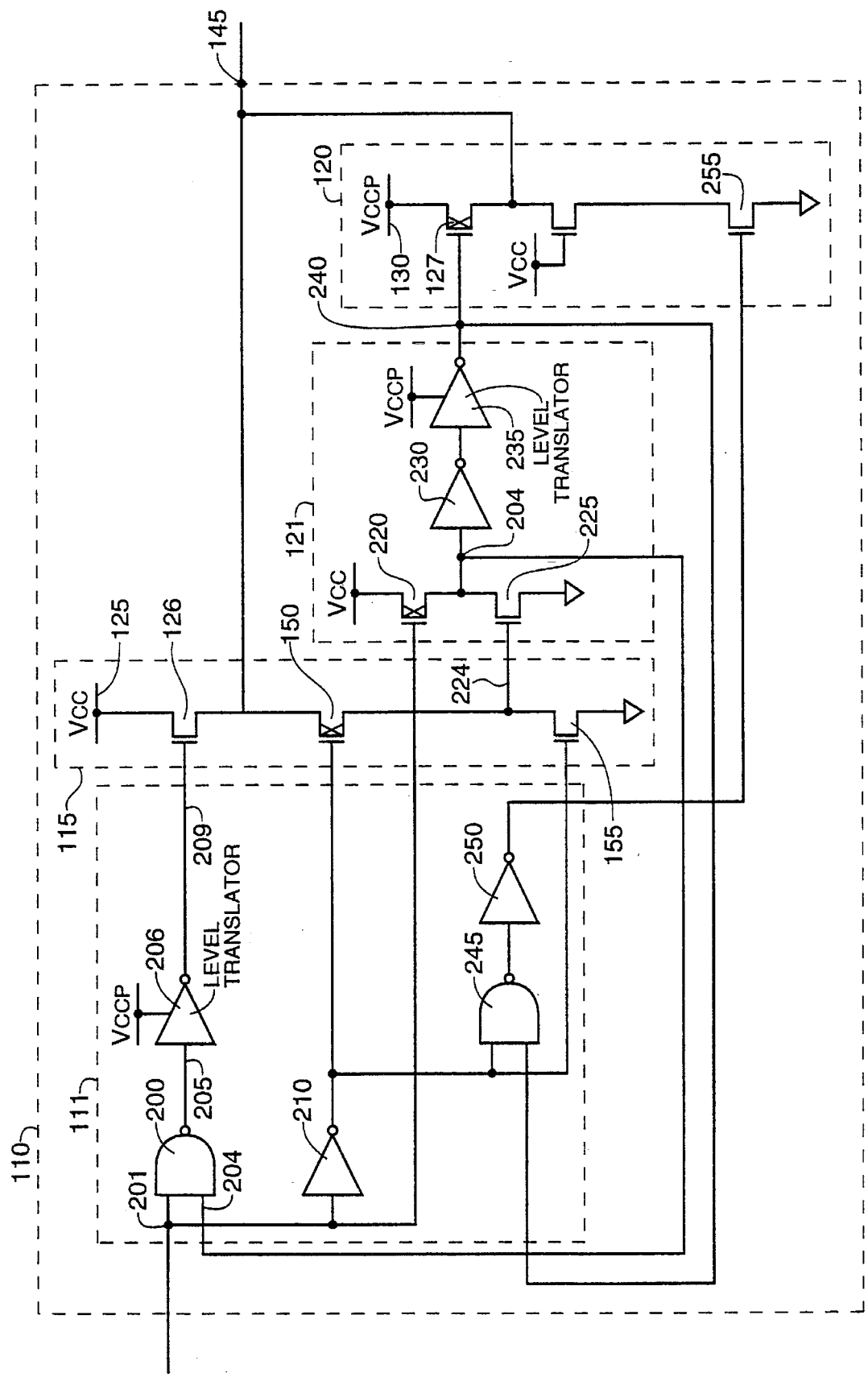
FIG. 4 is a more detailed schematic of a circuit of the invention.

FIG. 4 is a more detailed schematic of a level translator circuit 110 of the invention having a detector circuit 121 of the invention. A control circuit 111 responds to two internal signals generated in the detector circuit 121 and responds to an external signal to control the operation of the level translator circuit 110. The detector circuit 121 monitors first driver circuit 115 to determine when the potential of output node 145 has been fully driven toward the supply potential when coupled to node 125 through transistor 126. When this occurs the detector circuit 121 generates the internal signal which deactuates the first driver circuit 115 (transistor 126) and actuates the second driver circuit 120. Actuating the second driver circuit 120 actuates transistor 127 and couples output node 145 to the pumped supply node 130 through actuated transistor 127.

Since p-channel transistor 150 and n-channel transistor 155 are controlled by the same signal, the pull down portion of the first driver circuit 115 is not used to drive the reference potential to output node 145; rather, the pull down portion of the second driver circuit 120 is used to pull the output node to the reference potential when the isolation gates, shown in FIG. 2, are deactuated.

Although the invention has been described with respect to specific embodiments, the invention should be read as limited only by the claims.

What is claimed is:

1. A voltage level translator circuit, comprising:
   a) a first driver circuit in electrical communication with a supply node connected to a supply potential;
   b) a second driver circuit in electrical communication with a pumped supply node connected to a pumped potential;
   c) a common node in electrical communication with an output node of said first driver circuit and an output node of said second driver circuit, said first driver circuit driving a potential of said common node toward the supply potential and said second driver circuit driving the potential of said common node toward the pumped potential;
   d) a detector circuit in electrical communication with said first and said second driver circuits, said detector circuit configured to monitor an operation of said first driver circuit; and
   e) a control circuit in electrical communication with said detector circuit and in electrical communication with said first and said second driver circuits, said control circuit configured to respond to a signal generated in said detector circuit to control an actuation and deactuation of said first and said second driver circuits.

2. The circuit as specified in claim 1, wherein said pumped potential is greater than the supply potential.

3. The circuit as specified in claim 1, wherein said pumped potential is less than a reference potential.

4. A voltage level translator circuit, comprising:
   a) a first driver circuit in electrical communication with a supply node connected to a supply potential;
   b) a pump circuit for pumping the supply potential to a pumped potential;
   c) a second driver circuit in electrical communication with a pumped supply node connected to the pumped potential;
   d) a common node in electrical communication with an output node of said first driver circuit and an output node of said second driver circuit, said first driver circuit driving a potential of said common node toward the supply potential and said second driver circuit driving the potential of said common node toward the pumped potential;
   e) a detector circuit in electrical communication with said first and said second driver circuits, said detector circuit configured to monitor an operation of said first driver circuit; and
   f) a control circuit in electrical communication with said detector circuit and in electrical communication with said first and said second driver circuits, said control circuit configured to respond to a signal generated in said detector circuit to control an actuation and deactuation of said first and said second driver circuits.

5. The circuit as specified in claim 4, wherein the pumped potential is greater than the supply potential.

6. The circuit as specified in claim 4, wherein the pumped potential is less than a reference potential.

7. A voltage level translator circuit, comprising:
   a) a detector circuit having a control input;
   b) a first driver circuit in electrical communication with a supply node connected to a supply potential, an output of said first driver circuit in electrical communication with said control input, said first driver circuit driving a potential of said control input toward the supply potential when actuated;
   c) a pump circuit for pumping the supply potential to a pumped potential;
   d) a second driver circuit in electrical communication with a pumped supply node connected to the pumped potential, an output of said second driver circuit in electrical communication with the output of the first driver circuit; and
   e) a control circuit in electrical communication with said detector circuit and with said first and said second driver circuits said control circuit configured to respond to a signal generated in said detector circuit to control an actuation and deactuation of said first and said second driver circuits.

8. The circuit as specified in claim 7, wherein the pumped potential is greater than the supply potential.

9. The circuit as specified in claim 7, wherein the pumped potential is less than a reference potential.

10. A voltage level translator circuit, comprising:
    a) a first driver circuit in electrical communication with a supply node connected to a supply potential;
    b) a second driver circuit in electrical communication with a pumped supply node connected to a pumped potential greater than the supply potential;
    c) a common node in electrical communication with an output node of said first driver circuit and an output node of said second driver circuit, said first driver circuit driving a potential of said common node toward the supply potential and said second driver circuit driving the potential of said common node toward the pumped potential;
    d) a detector circuit in electrical communication with said common node, said detector circuit configured to monitor a potential of said common node;
    e) a control circuit in electrical communication with said detector circuit and in electrical communication with said first and second driver circuits, said control circuit configured to respond to a signal generated in said detector circuit in response to the potential on said common node to control the potential driven to the common node.

11. A voltage level translator circuit, comprising:
    a) a first driver circuit in electrical communication with a supply node connected to a supply potential;

b) a pump circuit for pumping the supply potential to a pumped potential greater than the supply potential;

c) a second driver circuit in electrical communication with a pumped supply node connected to the pumped potential;

d) a common node in electrical communication with an output node of said first driver circuit and an output node of said second driver circuit, said first driver circuit driving a potential of said common node toward the supply potential and said second driver circuit driving the potential of said common node toward the pumped potential;

e) a detector circuit in electrical communication with said first and said second driver circuits, said detector circuit configured to monitor an operation of said first driver circuit; and f) a control circuit in electrical communication with said detector circuit and in electrical communication with said first and said second driver circuits, said control circuit configured to respond to a signal generated in said detector circuit to control an actuation and deactuation of said first and said second driver circuits.

12. A voltage level translator circuit, comprising:

a) a detector circuit having a control input;

b) a first driver circuit in electrical communication with a supply node connected to a supply potential, an output of said first driver circuit in electrical communication with said control input, said first driver circuit driving a potential of said control input toward the supply potential when actuated;

c) a pump circuit for pumping the supply potential to a pumped potential greater than the supply potential; and d) a second driver circuit in electrical communication with a pumped supply node connected to the pumped potential, an output of said second driver circuit in electrical communication with the output of the first driver circuit; and e) a control circuit in electrical communication with said detector circuit and with said first and said second driver circuits said control circuit configured to respond to a signal generated in said detector circuit to control an actuation and deactuation of said first and said second driver circuits.

13. A method for driving a node to a potential comprising the following steps:

a) coupling the node to a supply potential;

b) driving the potential of the node toward the supply potential;

c) monitoring the potential of the node;

d) decoupling the node from the supply potential in response to said step of monitoring;

e) coupling the node to a pumped potential in response to said step of monitoring; and e) driving the potential of the node toward the pumped potential.

14. A method for coupling a digit line and an amplifier to one another comprising the following steps:

a) coupling a gate of an isolation transistor to a supply potential;

b) driving a potential of the gate toward the supply potential;

c) pumping a pumped supply node to a pumped potential;

d) monitoring the potential on the gate;

e) decoupling the gate from the supply potential in response to said step of monitoring;

f) coupling the gate to the pumped potential in response to said step of monitoring; and g) driving the potential of the gate toward the pumped potential h) actuating the isolation transistor in response to said step of driving; and i) coupling the digit line and the amplifier to each other in response to said step actuating.

15. An integrated circuit, comprising:

a digit line for accepting data;

a sense amplifier for amplifying the data;

an isolation device interposed between the digit line and the sense amplifier and having a control input, said isolation device configured to couple said digit line and said sense amplifier to each other when actuated;

a first driver circuit in electrical communication with a supply node connected to a supply potential, said first driver circuit in electrical communication with said control input and configured to drive a potential of said control input toward the supply potential when actuated;

a second driver circuit in electrical communication with a pumped supply node connected to a pumped potential, said second driver circuit in electrical communication with said control input and configured to drive the potential of said control input toward the pumped potential when actuated; and means for selectively actuating one and deactuating the other of said first and said second driver circuits, said means in electrical communication with an input of said first driver circuit and an input of said second driver circuit and configured to respond to a potential on said control input, said isolation device configured to actuate in response to said second driver circuit actuating.

16. A method for selectively coupling a digit line to a sense amplifier, comprising the steps of:

driving a potential of a gate of an isolation device to a first potential less than or equal to a supply potential;

monitoring the potential on the gate;

driving the potential of the gate from the first potential to a second potential greater than the supply potential and less than or equal to a pumped potential in response to the gate attaining the first potential;

actuating an isolation device in response to the second supply potential on the gate; and coupling the digit line to the sense amplifier in response to said step of actuating.

* * * * *

UNITED STATES PATENT AND TRADEMARK OFFICE
CERTIFICATE OF CORRECTION

PATENT NO. : 5,614,859
DATED : March 25, 1997
INVENTOR(S) : Ong

It is certified that error appears in the above-indentified patent and that said Letters Patent is hereby corrected as shown below:

Column 2, line 5, after "of" please delete -- , -- (comma).

Column 2, line 46, after "line" please add -- pair --.

Column 4, line 32, after "circuits" please add -- , -- (comma).

Column 5, line 42, after "circuits" please add -- , -- (comma).

Signed and Sealed this

Twenty-ninth Day of July, 1997

Attest:

BRUCE LEHMAN

Attesting Officer     Commissioner of Patents and Trademarks